(12) United States Patent
Lee et al.

(10) Patent No.: US 12,144,147 B2
(45) Date of Patent: Nov. 12, 2024

(54) COOLING APPARATUS FOR POWER MODULE

(71) Applicants: Hyundai Motor Company, Seoul (KR); Kia Corporation, Seoul (KR)

(72) Inventors: Sang Hun Lee, Taebaek-si (KR); Hyong Joon Park, Hwaseong-si (KR); Se Heun Kwon, Incheon (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 183 days.

(21) Appl. No.: 17/987,199

(22) Filed: Nov. 15, 2022

(65) Prior Publication Data

US 2023/0371200 A1  Nov. 16, 2023

(30) Foreign Application Priority Data

May 11, 2022  (KR) ........................ 10-2022-0057813

(51) Int. Cl.
*H05K 7/20* (2006.01)
*H01L 23/473* (2006.01)

(52) U.S. Cl.
CPC ....... *H05K 7/20272* (2013.01); *H01L 23/473* (2013.01); *H05K 7/20254* (2013.01); *H05K 7/20418* (2013.01); *H05K 7/20927* (2013.01)

(58) Field of Classification Search
CPC ........... H05K 7/20254; H05K 7/20445; H05K 7/20927; H01L 23/473; H01L 23/4735
See application file for complete search history.

(56) References Cited

U.S. PATENT DOCUMENTS

| 9,445,526 B2 | 9/2016 | Zhou et al. |
| 11,357,139 B2* | 6/2022 | Lee ...................... H01L 23/473 |
| 2011/0317368 A1 | 12/2011 | Pautsch et al. |
| 2012/0325441 A1 | 12/2012 | Brandenburg et al. |
| 2013/0301328 A1 | 11/2013 | Ito |

(Continued)

FOREIGN PATENT DOCUMENTS

| EP | 1840962 A1 | 10/2007 |
| GB | 2574632 A | 12/2019 |

(Continued)

OTHER PUBLICATIONS

European Patent Office, Extended European search report, issued in European Application No. 22208300.8, Sep. 26, 2023, 7 pages.

*Primary Examiner* — Robert J Hoffberg
(74) *Attorney, Agent, or Firm* — Slater Matsil, LLP

(57) ABSTRACT

An embodiment cooling apparatus for a power module includes a manifold cover provided with an inner space that defines a flow path for a cooling fluid and in which the power module can be embedded, a fin plate embedded in the manifold cover so as to contact the power module and including a plurality of cooling fins on a surface facing an inner surface of the manifold cover, and a guide wall extending from the inner surface of the manifold cover in a flow direction of the cooling fluid to define a plurality of first channels having first closed ends and second channels having second closed ends, the guide wall overlapping the cooling fins and having an end portion in contact with the cooling fins to allow the cooling fluid to flow to the first channels and the second channels between the cooling fins in the manifold cover.

18 Claims, 6 Drawing Sheets

(56) References Cited

U.S. PATENT DOCUMENTS

| | | | |
|---|---|---|---|
| 2016/0216042 A1 | 7/2016 | Bozorgi et al. | |
| 2018/0328675 A1 | 11/2018 | Jo et al. | |
| 2021/0080197 A1 | 3/2021 | Carney et al. | |
| 2021/0280498 A1* | 9/2021 | Kang | H01L 23/3675 |
| 2023/0189487 A1* | 6/2023 | Kwon | H05K 7/20254 |
| | | | 361/699 |
| 2023/0200008 A1* | 6/2023 | Lee | H05K 7/20927 |
| | | | 361/699 |

FOREIGN PATENT DOCUMENTS

| | | |
|---|---|---|
| JP | 2007110025 A | 4/2007 |
| JP | 2014022490 A | 2/2014 |
| KR | 19990009857 A | 2/1999 |
| KR | 20200092926 A | 8/2020 |
| KR | 20230090747 A | 6/2023 |

* cited by examiner

COOLING APPARATUS FOR POWER MODULE

CROSS-REFERENCE TO RELATED APPLICATIONS

This application claims the benefit of Korean Patent Application No. 10-2022-0057813, filed on May 11, 2022, which application is hereby incorporated herein by reference.

TECHNICAL FIELD

The present disclosure relates to a cooling apparatus for a power module.

BACKGROUND

A power module is applied to an electric vehicle or the like and controls a high voltage and a high current. Accordingly, a large amount of heat is generated, and thus an appropriate cooling is required to maintain the performance and durability of the power module. To this end, the power module is cooled through a cooling fluid, or a waste heat of the power module is used for heating in a vehicle or the like.

In general, a cooling apparatus is connected to one side surface of a power module, and a cooling fluid flows to the cooling apparatus to cool the power module in the case of the related art. However, in the case of conventional cooling apparatuses, a cooling efficiency is not high because a simple tube structure or a fin structure which is generally used is used.

The cooling efficiency of electric vehicles or the like is closely related to an overall energy efficiency of the vehicle, and it needs to increase the cooling efficiency for a power module through a new cooling structure.

Furthermore, since there is no conventional method for improving the flowability of a cooling fluid for cooling a power module, the cooling performance is degraded due to a loss in the flow of the cooling fluid.

The matters described as the background art are for the purpose of enhancing the understanding of the background of embodiments of the present disclosure and should not be taken as acknowledging that the matters correspond to the related art already known to those skilled in the art.

SUMMARY

The present disclosure relates to a cooling apparatus for a power module. Particular embodiments relate to a cooling apparatus for a power module which cools a power module using a cooling fluid.

An embodiment of the present disclosure provides a cooling apparatus for a power module which generates a vertical turbulent flow of the cooling fluid by perpendicularly spraying the cooling fluid onto a heating surface through a cooling fin of the fin plate configured in a direction perpendicular to a longitudinal direction of a manifold cover, and thus cooling efficiency is secured and the flowability of the cooling fluid is improved to minimize flow quantity loss due to vertical turbulent flow.

The cooling apparatus for a power module according to embodiments of the present disclosure includes a manifold cover provided with an inner space through which the cooling fluid flows and in which a power module is embedded, a fin plate that is embedded in the manifold cover, is in contact with the power module, and is provided with a plurality of cooling fins on a surface facing an inner surface of the manifold cover, and a guide wall extending from the inner surface of the manifold cover in a flow direction of the cooling fluid to form a plurality of first channels with first closed ends and second channels with second closed ends and having an end portion formed in contact with the cooling fins of the fin plate to allow the cooling fluid to flow to a first channel and a second channel between the cooling fins of the fin plate in the manifold cover, wherein the end portion of guide wall is formed to overlap the cooling fins of the fin plate when the power module and the fin plate are mounted on the manifold cover.

An extension direction of the guide wall may perpendicularly intersect the extension direction of the cooling fin.

The end portion of the guide wall may be cut to be inclined in a direction perpendicular to the first channel and the second channel and formed to have an inclined surface.

The end portion of the guide wall may be formed so that both sides of the end portion are cut to be inclined in a direction perpendicular to the first channel and the second channel.

The end portion of the guide wall may have a plurality of contact points to the cooling fins of the fin plate by forming a plurality of contact portions of which a width gradually decreases toward the fin plate.

A contact protrusion formed to extend in an extension direction of the cooling fins of the fin plate may be formed on the end portion of the guide wall.

The guide wall may include a plurality of wall units extending to divide the first channels and the second channels, first blocking units connected to first sides of the wall units to close first ends of the first channels and second blocking units connected to second sides of the wall units to close second ends of the second channels.

The first channel and the second channel may be alternately arranged because the guide wall is provided with the first blocking units and the second blocking units connecting the plurality of wall units.

The manifold cover may be coupled to an edge to the fin plate by welding, bonding, or bolting.

The manifold cover may include a first manifold cover and a second manifold cover, each of which has any one of an inlet and an outlet, and the fin plate may be disposed in contact with each of two side surfaces of the power module and may include a first fin plate having a first flow hole formed therein and a second fin plate having a second flow hole formed therein so that the cooling fluid flows between the manifold covers to perform cooling on both sides of the power module.

The inlet or outlet is formed at one side of each of the first manifold cover and the second manifold cover, and the first flow hole of the first fin plate and the second flow hole of the second fin plate are formed at the other side thereof.

DETAILED DESCRIPTION OF ILLUSTRATIVE EMBODIMENTS

Figure 1:
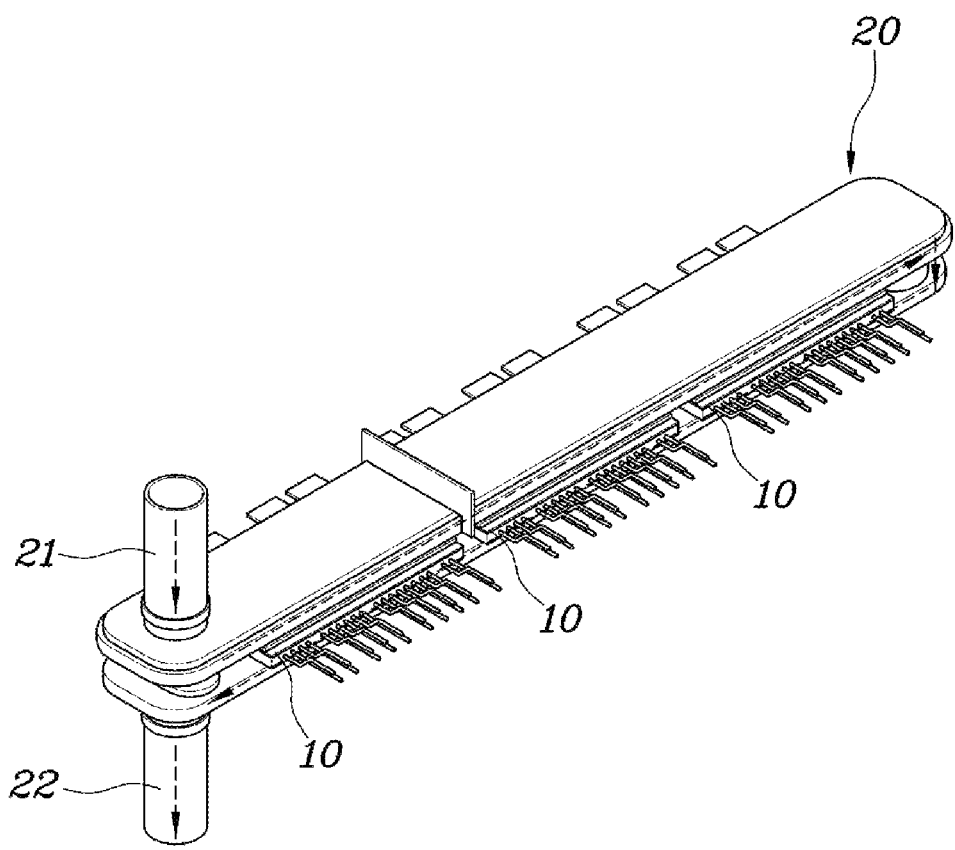
FIG. 1 is a view illustrating a cooling apparatus for a power module according to embodiments of the present disclosure.

Hereinafter, the present disclosure will be described in detail by describing disclosed embodiments of the present specification with reference to the accompanying drawings. However, regardless of the reference character, the same or similar constituent elements shall be given the same reference number and the redundant descriptions shall be omitted.

The suffix "module" and "unit" for the constituent elements used in the description below are given or mixed for ease of description, and do not have any distinctive meaning or role in itself.

Furthermore, in describing the embodiments of the present specification, when a specific description of the related art is deemed to obscure the essential points of the embodiments of the present specification, the detailed description will be omitted. Furthermore, the accompanying drawings are intended to facilitate the understanding of the embodiments set forth in the present specification, not to limit the technical idea of the present specification by the accompanying drawings. All alterations, equivalents, and substitutes that are included within the technical idea of the present disclosure should be understood as falling within the scope of the present disclosure.

The ordinal number terms first, second, and so on may be used to describe various constituent elements but should not limit the meanings of these constituent elements. These terms are only used to distinguish one constituent element from another element.

It should be understood that a constituent element, when referred to as being "connected to" or "coupled to" a different constituent element, may be directly connected or directly coupled to the different constituent element or may be coupled or connected to the different constituent element with a third constituent element disposed therebetween. In contrast, it should be understood that a constituent element, when referred to as being "directly coupled to" or "directly connected to" a different constituent element, is coupled or connected to the different constituent element without a third constituent element therebetween.

A noun in singular form has the same meaning as nouns when used in plural form, unless it has a different meaning in context.

It should be understood that, throughout the present specification, the term "include," "have," or the like is intended to indicate that a feature, a number, a step, an operation, a constituent element, a component, or a combination thereof is present, without precluding the possibility that one or more other features, numbers, steps, operations, constituent elements, components, or a combination thereof will be present or added.

Figure 2:
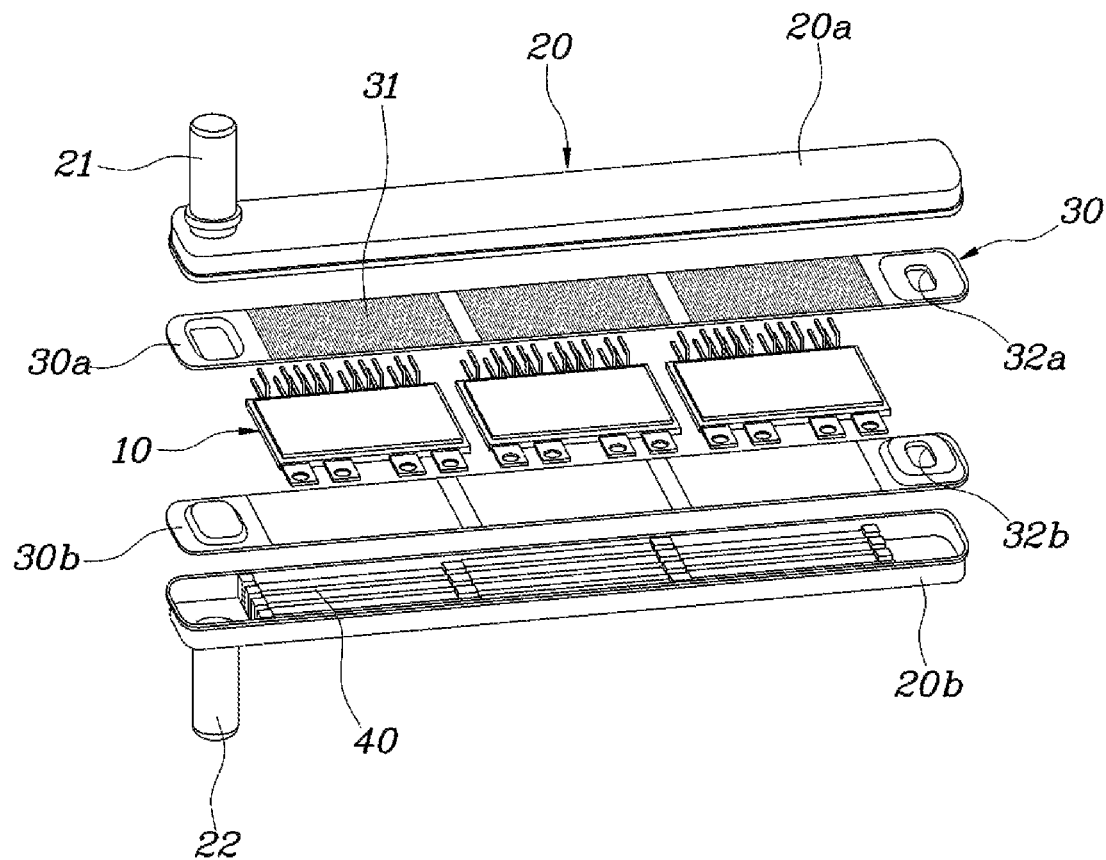
FIG. 2 is an assembly view of the cooling apparatus for a power module shown in FIG. 1.
Figure 3:
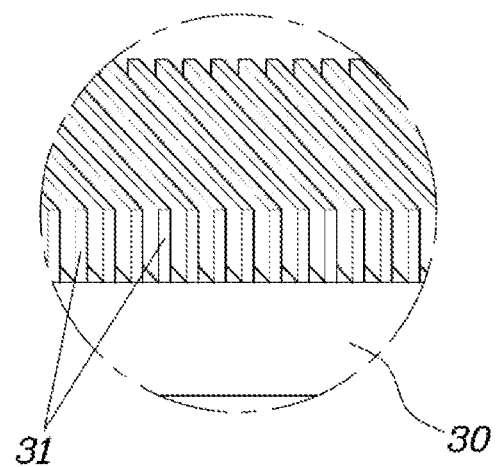
FIG. 3 is a view illustrating cooling fins of a fin plate according to embodiments of the present disclosure.
Figure 4:
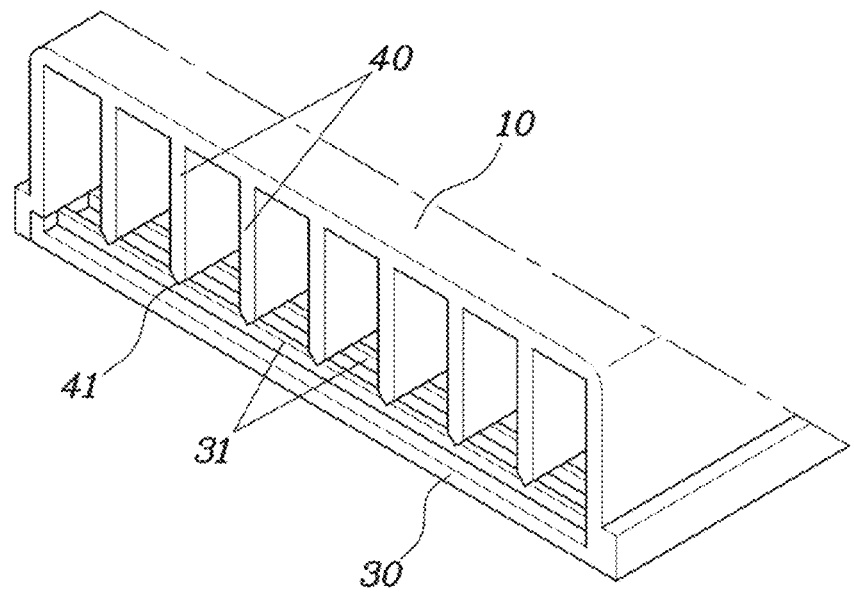
FIG. 4 is a view illustrating a connection structure of a guide wall and the fin plate according to embodiments of the present disclosure.
Figure 5:
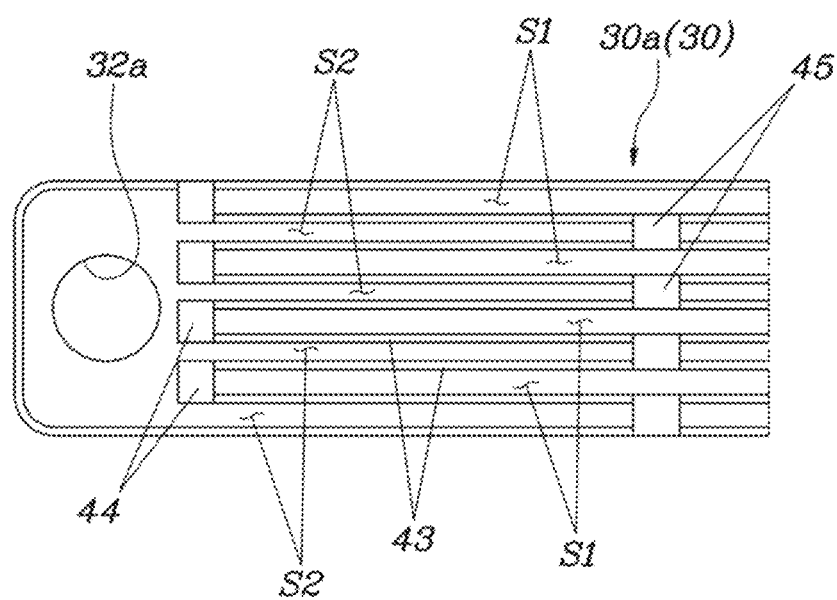
FIG. 5 is a view illustrating a guide wall of a manifold cover according to embodiments of the present disclosure.
Figure 6:
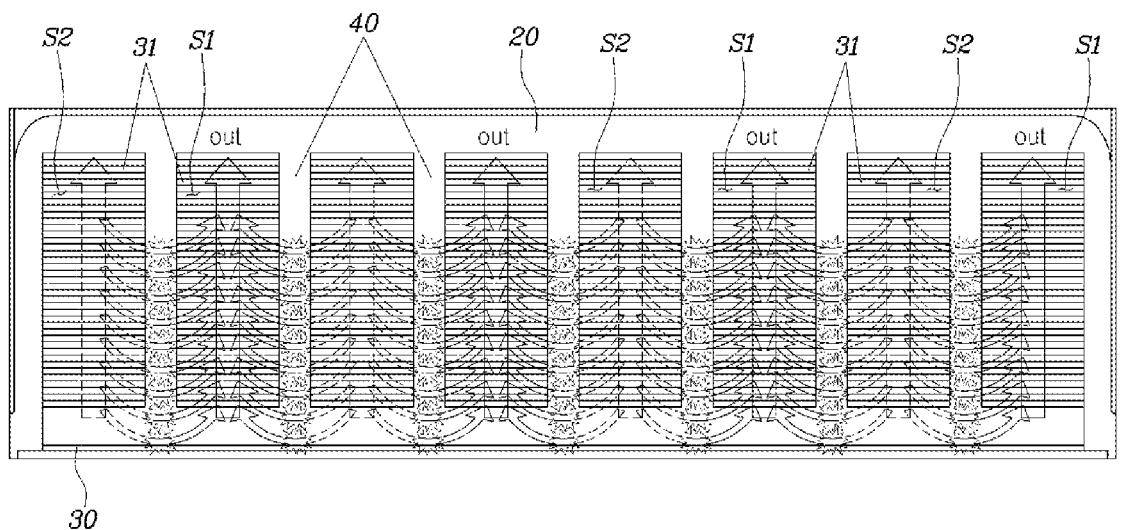
FIG. 6 is a view for describing a jet collision effect of the cooling apparatus for a power module according to embodiments of the present disclosure.
Figure 7:
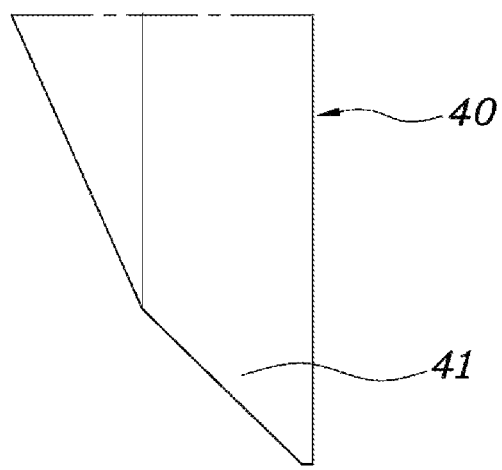
FIG. 7 is a view illustrating an example of the guide wall according to embodiments of the present disclosure.
Figure 8:
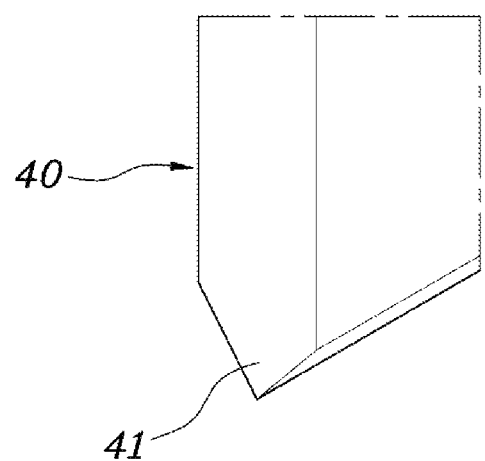
FIG. 8 is a view illustrating another example of the guide wall according to embodiments of the present disclosure.
Figure 9:
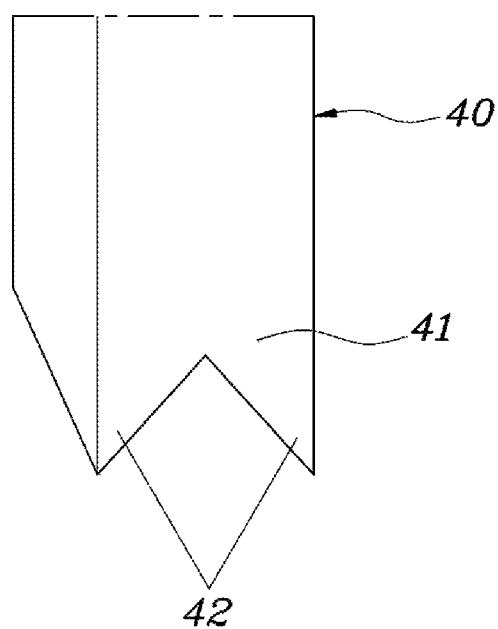
FIG. 9 is a view illustrating still another example of the guide wall according to embodiments of the present disclosure.
Figure 10:
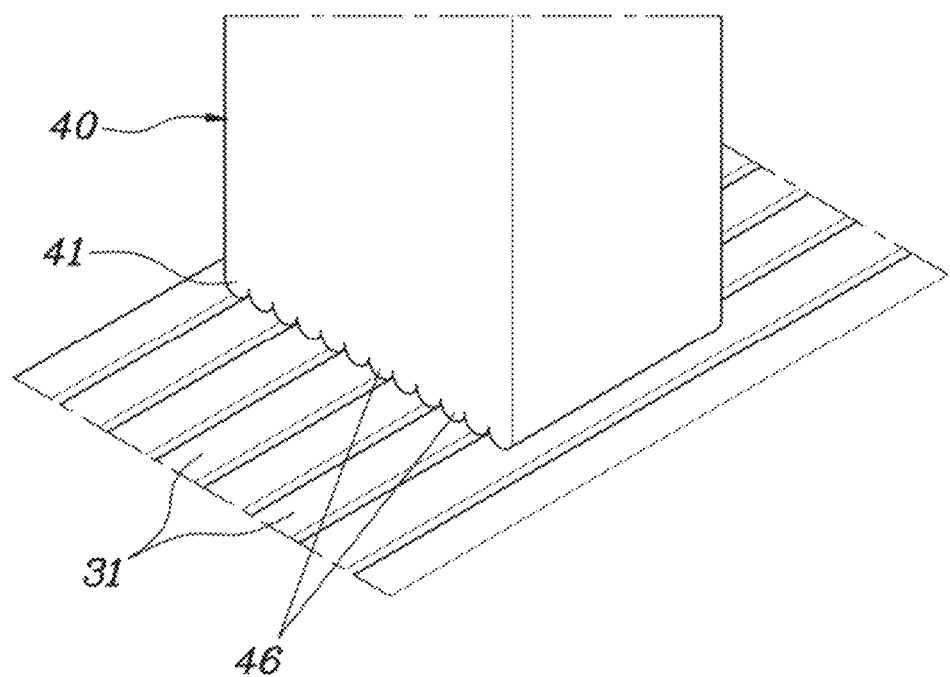
FIG. 10 is a view illustrating yet another example of the guide wall according to embodiments of the present disclosure.

FIG. 1 is a view illustrating a cooling apparatus for a power module according to embodiments of the present disclosure, FIG. 2 is an assembly view of the cooling apparatus for a power module shown in FIG. 1, FIG. 3 is a view illustrating a cooling fin of a fin plate according to embodiments of the present disclosure, FIG. 4 is a view illustrating a connection structure of a guide wall and the fin plate according to embodiments of the present disclosure, FIG. 5 is a view illustrating a guide wall of a manifold cover according to embodiments of the present disclosure, FIG. 6 is a view for describing a jet collision effect of the cooling apparatus for a power module according to embodiments of the present disclosure, FIG. 7 is a view illustrating an example of the guide wall according to embodiments of the present disclosure, FIG. 8 is a view illustrating another example of the guide wall according to embodiments of the present disclosure, FIG. 9 is a view illustrating still another example of the guide wall according to embodiments of the present disclosure, and FIG. 10 is a view illustrating yet another example of the guide wall according to embodiments of the present disclosure.

As illustrated in FIGS. 1 to 5, the cooling apparatus for a power module according to embodiments of the present disclosure includes a manifold cover 20 provided with an inner space through which a cooling fluid flows and in which a power module 10 is embedded, a fin plate 30 that is embedded in the manifold cover 20, is in contact with the power module 10, and is provided with a plurality of cooling fins 31 on a surface facing an inner surface of the manifold cover 20, and a guide wall 40 extending from the inner surface of the manifold cover 20 in a flow direction of the cooling fluid to form a plurality of first channels S1 with first closed ends and second channels S2 with second closed ends, and the guide wall 40 formed in contact with the cooling fin 31 of the fin plate 30 so that the guide wall allows the cooling fluid to flow to the first channels S1 and the second channels S2 between the cooling fins 31 of the fin plate 30 in the manifold cover 20.

Particularly, in embodiments of the present disclosure, the guide wall 40 is formed in contact with the cooling fin 31 of the fin plate 30 to form a flow so that the cooling fluid flows only through the cooling fin 31.

That is, when the power module 10 and the fin plate 30 are mounted on the manifold cover 20, an end portion 41 of the guide wall 40 is formed to overlap the cooling fin 31 of the fin plate 30. As described above, the guide wall 40 is formed to extend such that the end portion 41 overlaps the cooling fin 31 of the fin plate 30, and thus contact portions of the guide wall 40 or the cooling fin 31 may be deformed in close contact with each other without a gap. For this reason, since the guide wall 40 is pressed against the cooling fin 31 without the gap, the cooling fluid limits a flow in another direction except for a flow through the cooling fin 31. Accordingly, a cooling flow quantity is ensured because the cooling fluid flows to the first channel S1 and the second channel S2, thereby improving cooling performance through the cooling fluid.

Meanwhile, the manifold cover 20 is formed so that the cooling fluid flows therein and is provided with an inlet 21 through which the cooling fluid is introduced and an outlet 22 through which the cooling fluid heat-exchanged with the power module 10 is discharged. The inlet 21 and the outlet 22 of the manifold cover 20 may be formed in series, and although the cooling fluid flows in a vertical direction in the drawings, the flow direction may be reversed therefrom and is not limited to the vertical direction.

The power module 10 and the fin plate 30 are embedded in the inner space of the manifold cover 20, and when a flow rate is controlled by the cooling fin 31 of the fin plate 30, the cooling fluid is formed with a jet collision cooling structure, thereby increasing heat exchange efficiency with the power module 10.

The guide wall 40 is formed on the inner surface of the manifold cover 20, and the guide wall 40 divides a plurality of cooling channels extending in a direction in which the cooling fluid flows from the inlet to the outlet. That is, the guide wall 40 extends from the inner surface of the manifold cover 20 in the flow direction of the cooling fluid and forms a plurality of first channels S1 with first closed ends and a plurality of second channels S2 with second closed ends.

Furthermore, the fin plate 30 is provided inside the manifold cover 20. The fin plate 30 is in contact with the power module 10, and the cooling fins 31 are formed so that the cooling fluid introduced from the inlet to the second channel S2 flows from the first channel S1 toward the outlet. Herein, the manifold cover 20 may be coupled to an edge of the fin plate 30 by welding, bonding, or bolting.

That is, the cooling fluid is guided to the second channel S2, and since the other end of the second channel S2 is blocked, the cooling fluid forms a jet collision cooling structure through a flow along which the cooling fluid flows in the first channel S1 between the cooling fins 31. Accordingly, heat exchange efficiency between the cooling fluid and the fin plate 30 is increased, thereby ensuring cooling performance of the power module 10 through the fin plate 30.

Particularly, in embodiments of the present disclosure, the guide wall 40 formed on the inner surface of the manifold cover 20 is formed in contact with the cooling fin 31 of the fin plate 30. When the guide wall 40 of the manifold cover 20 is spaced apart from the cooling fin 31 of the fin plate 30 with a gap generated therebetween, the cooling fluid may not pass between the cooling fins 31 and may bypass due to the gap, thereby reducing heat exchange efficiency.

Therefore, the guide wall 40 is formed in contact with the cooling fin 31 of the fin plate 30 so that the cooling fluid flows only between the cooling fins 31 when the cooling fluid flows between the first channel S1 and the second channel S2, thereby ensuring heat exchange performance.

To describe embodiments of the present disclosure in detail, an extension direction of the guide wall 40 and an extension direction of the cooling fin 31 intersect perpendicularly.

That is, since the guide wall 40 extends in a longitudinal direction of the manifold cover 20, the first channel S1 and the second channel S2 extend in the longitudinal direction of the manifold cover 20 so that the cooling fluid may flow from the inlet to the outlet. Furthermore, since the cooling fin 31 is formed to extend in a direction perpendicular to the extension direction of the guide wall 40, the cooling fluid may flow from the second channel S2 to the first channel S1 through the cooling fin 31. Accordingly, in a flowing process of the cooling fluid from the second channel S2 to the first channel S1, generation of turbulence having a vertical speed component is induced, and thus the jet collision cooling structure can be formed.

In detail, the guide wall 40 may include a plurality of wall units 43 extending to divide the first channels S1 and the second channels S2, first blocking units 44 connected to first sides of the wall units 43 to close first ends of the first channels S1, and second blocking units 45 connected to second sides of the wall units 43 to close second ends of the second channels S2.

As illustrated in FIG. 5, the guide wall 40 includes the plurality of wall units 43, the first blocking units 44, and the second blocking units 45. The cooling fluid flows through the inlet 21 of the manifold cover 20 from the second channel S2 to the first channel S1 to discharge through the outlet 22. The guide wall 40 according to an embodiment of the present disclosure is disclosed with a form in which the wall units 43 are perpendicularly connected to the first blocking units 44 and the second blocking units 45, but is not limited thereto. The cooling fins 31 of the fin plate 30 are in contact with the guide wall 40 and formed together with the first channels S1 and the second channels S2, and the cooling fluid flows through the cooling fins 31 to the first channels S1 and the second channels S2.

Furthermore, the guide wall 40 is formed to have the same separation distance between the wall units 43 and the same shape of the first and second blocking units 44 and 45 so that the flowability of the cooling fluid flowing through the first and second channels S1 and S2 may be constant.

Furthermore, since the first blocking units 44 and the second blocking units 45 connecting the plurality of wall units 43 are formed on the guide wall 40, the first channels S1 and the second channels S2 may be alternately arranged.

That is, the guide walls 40 are arranged such that the plurality of wall units 43 are spaced apart from each other, and the wall units 43 are connected to each other and integrated through the first and second blocking units 44 and 45. As the first blocking unit 44 is located at one end of the wall unit 43 and connected to another adjacent wall unit 43, the first channel S1 with the second open end of the wall unit 43 may be formed. Since the second blocking unit 45 is located at the other end of the wall unit 43 and connected to another adjacent wall unit 43, the second channel S2 with the first open end of the wall unit 43 may be formed.

Since the first blocking units 44 and the second blocking units 45 are alternately arranged on the wall units 43, the first channels S1 and the second channels S2 are alternately formed in the guide wall 40, and the cooling fluid flows to the first channels S1 and the second channels S2 to easily form the jet collision cooling structure.

Furthermore, the first blocking units 44 and the second blocking units 45 may be disposed apart from each other in the longitudinal direction of the wall unit 43 and are formed to be alternately arranged in the vertical direction to form a flow in which the cooling fluid repeatedly flows to the first channels S1 and the second channels S2, and thus jet collision cooling may occur multiple times to further improve cooling performance.

Thus, embodiments of the present disclosure provide an apparatus using a cooling fluid to cool a power module, and a jet collision cooling effect is applied in order to cool the power module. That is, the jet collision cooling is a cooling method capable of locally obtaining a high heat transmission effect by directly spraying the cooling fluid onto a high-temperature wall surface to dissipate a heat. For actively implementing a jet cooling method effect, it is necessary to use a turbulent flow rather than a laminar flow. Herein, a turbulence refers to a flow with a velocity component in a direction perpendicular to the flow direction, which is a flow which is not in the flow direction and is irregular and diffusible with a 3D vorticity of the top, bottom, left, and right. When the turbulence occurs around an object, a mixing of the cooling area and the cooling fluid becomes larger, and accordingly, the cooling efficiency can be increased. Accordingly, as illustrated in FIG. 6, the cooling fluid flows from the inlet to form an inlet plenum which is the sum of narrow water streams. The manifold cover 20 is guided based on the guide wall 40 such that the cooling fluid introduced into the first channel S1 or the second channel S2 is discharged through a plurality of cooling fins 31 to form micro channels. That is, the cooling fluid introduced into the second channel S2 is blocked at the outlet side because a direction in which the cooling fins 31 are formed and a direction in which the guide wall 40 is formed intersect each other and flows into the first channel S1 through a gap between the cooling fins 31, and thus the turbulence is formed. Furthermore, the first channel S1 is blocked at the inlet side, and the cooling fluid flows toward the outlet side and then passes through the cooling fins 31. Accordingly, the cooling fluid of the first channel S1 having irregularity and high diffusivity forms a higher jet cooling collision effect.

Meanwhile, the guide wall 40 of embodiments of the present disclosure may be applied in various examples.

As an example, the guide wall 40 may be formed so that the end portion 41 is cut to be inclined in the direction perpendicular to the first channel S1 and the second channel S2 to have an inclined surface.

As illustrated in FIG. 7, the guide wall 40 may be formed in the shape of a right triangle because the end portion 41 is formed to be inclined. Furthermore, the end portion 41 of the guide wall 40 may be formed to be inclined in the direction perpendicular to the first channel S1 and the second channel S2, and thus may be seated on the cooling fin 31 instead of being inserted between the cooling fins 31 of the fin plate 30. Furthermore, since the end portion 41 of the guide wall 40 is formed to overlap the cooling fin 31, the guide wall 40 or the cooling fin 31 is buckled and pressed against each other without a gap, and the end portion 41 of the guide wall 40 has a right triangular shape, thereby having the shape of a consistent buckling in any one direction.

In another example, the end portion 41 of the guide wall 40 may be formed in the shape of a wedge, since both sides thereof are cut to be inclined in the direction perpendicular to the first channel S1 and the second channel S2.

As illustrated in FIG. 8, since the end portion 41 of the guide wall 40 is formed in the shape of the wedge, when the guide wall 40 comes into contact with the cooling fin 31 of the fin plate 30, the end portion 41 of the guide wall 40 may be in close contact with the cooling fin 31 while buckling. That is, when the end portion 41 of the guide wall 40 is formed in the shape of the wedge, self-rigidity is ensured, and heat transmission through the fin plate 30 is smoothly performed. But since the fin plate 30 is formed of a material with low rigidity and deformable compared to the manifold cover 20, the end portion 41 of the guide wall 40 may be in close contact with the cooling fin 31 while buckling.

In still another example, a plurality of contact portions 42 having a width that gradually decreases toward the fin plate 30 are formed at the end portion 41 of the guide wall 40, thereby having multiple contact points to the cooling fin 31 of the fin plate 30.

As illustrated in FIG. 9, since the plurality of contact portions 42 are formed at the end portion 41 of the guide wall 40, the plurality of contact portions 42 may have multiple contact points to the cooling fin 31 of the fin plate 30. Furthermore, the contact portion 42 is formed to gradually decrease the width of both side surfaces in the direction perpendicular to the first channel S1 and the second channel S2, and thus may be seated on the cooling fin 31 instead of being inserted between the cooling fins 31 of the fin plate 30. As described above, since the plurality of contact portions 42 are formed at the end portion 41 of the guide wall 40, when a contact area with the cooling fin 31 of the fin plate 30 increases, the gap between the guide wall 40 and the cooling fin 31 may be removed.

As yet another example, a contact protrusion 46 formed to extend in the extension direction of the cooling fin 31 of the fin plate 30 may be formed on the end portion 41 of the guide wall 40.

As illustrated in FIG. 10, since the plurality of contact protrusions 46 are formed on the end portion 41 of the guide wall 40, multiple contact points to the cooling fin 31 of the fin plate 30 can be formed. In particular, since the contact protrusion 46 is formed to extend in the extension direction of the cooling fin 31, the contact protrusion 46 is inserted between the cooling fins 31 of the fin plate 30 or is buckled to the cooling fin 31, and the end portion 41 of the guide wall 40 has the form of being in close contact with the cooling fin 31. Accordingly, the gap between the end portion 41 of the guide wall 40 and the cooling fin 31 of the fin plate 30 can be removed.

The shape of the end portion 41 of the guide wall 40 described above is not limited to the above and may be applied in various embodiments. In particular, when the gap between the guide wall 40 and the cooling fin 31 is removed through each embodiment of the present disclosure, the jet collision cooling effect can be implemented without loss. That is, in the related art, since a structure for removing the gap between the guide wall 40 and the cooling fin 31 is not applied, the gap is generated between the guide wall 40 and the cooling fin 31, and thus the cooling effect is degraded due to a bypass of the cooling fluid.

As described above, in embodiments of the present disclosure, the bypass of the cooling fluid is prevented by removing the gap between the guide wall 40 and the cooling fin 31, thereby securing the jet collision effect the most.

Meanwhile, the manifold cover 20 according to embodiments of the present disclosure may include a first manifold cover 20a and a second manifold cover l0b having any one of the inlet 21 and the outlet 22. The fin plate 30 is disposed in contact with both side surfaces of the power module 10 and includes a first fin plate 30a having a first flow hole 32a and a second fin plate 30b having a second flow hole 32b so that the cooling fluid flows between the manifold covers 20, and thus the power module 10 may be cooled at both sides.

In this way, an exterior of the cooling apparatus is formed when the first manifold cover 20a and the second manifold cover l0b are coupled to each other. The first fin plate 30a and the second fin plate 30b are disposed around the power module 10 in an inner space of the first manifold cover 20a and the second manifold cover 20b, and thus both-sided cooling of the power module 10 may be performed.

In embodiments of the present disclosure, since the inlet 21 is formed in the first manifold cover 20a and the outlet 22 is formed in the second manifold cover 20b, the cooling fluid introduced through the guide wall 40 of the first manifold cover 20a and the cooling fin 31 of the first fin plate 30a flows to the first channel S1 and the second channel S2 in the first manifold cover 20a to implement the jet collision cooling. The cooling fluid passing through the first flow hole 32a and the second flow hole 32b flows to the first channel S1 and the second channel S2 in the second manifold cover 20b through the guide wall 40 of the second fin plate 30b to implement the jet collision cooling. Accordingly, the cooling of the power module 10 may be performed on both side surfaces.

Herein, the inlet 21 or the outlet 22 may be formed at one side of each of the first manifold cover 20a and the second manifold cover 20b, and the first flow hole 32a of the first fin plate 30a and the second flow hole 32b of the second fin plate 30b may be formed at the other side.

In embodiments of the present disclosure, the inlet 21 may be formed in the first manifold cover 20a, the outlet 22 may be formed in the second manifold cover 20b, and the inlet 21 and the outlet 22 are collinearly disposed to manufacture one manifold cover 20, and thus the first manifold cover 20a and the second manifold cover 20b may be implemented.

Since the inlet 21 and the outlet 22 of each manifold cover 20 are located at one side and the flow hole of each fin plate 30 are located at the other side, the cooling fluid may form the flow of the inlet 21—the first manifold cover 20a and the first fin plate 30a—the first flow hole 32a—the second flow hole 32b—the second manifold cover 20b and the second fin plate 30b—the outlet 22. Furthermore, in the first channel S1 and the second channel S2 formed by the first manifold cover 20a and the first fin plate 30a, the jet collision cooling by a fluid flow is implemented to heat-exchange with one side surface of the power module 10. In the first channel S1 and the second channel S2 formed by the second manifold cover 20b and the second fin plate 30b, the jet collision cooling by the fluid flow is implemented to heat-exchange with the other side surface of the power module 10, and thus both-sided cooling of the power module 10 may be implemented.

The cooling apparatus for a power module having the structure described above generates a vertical turbulent flow of a cooling fluid by perpendicularly spraying the cooling fluid to a heating surface through a cooling fin of a fin plate configured in the direction perpendicular to a longitudinal direction of a manifold cover, and thus the cooling efficiency is secured, and the flowability of the cooling fluid is improved to minimize flow quantity loss due to vertical turbulent flow.

Although specific exemplary embodiments of the present disclosure have been shown and described, it will be apparent to those skilled in the art that the present disclosure may be variously modified and changed without departing from the technical spirit of the present disclosure provided by the appended claims.

What is claimed is:

1. A cooling apparatus for a power module, the cooling apparatus comprising:
   a manifold cover provided with an inner space that defines a flow path for a cooling fluid and in which the power module can be embedded;
   a fin plate embedded in the manifold cover and positioned so as to contact the power module when the power module is embedded in the flow path, the fin plate comprising a plurality of cooling fins on a surface of the fin plate, the cooling fins projecting toward an inner surface of the manifold cover, the cooling fins extending in a direction perpendicular to a flow direction of the cooling fluid; and
   a guide wall projecting from the inner surface of the manifold cover, the guide wall extending in the flow direction of the cooling fluid, the guide wall defines a plurality of first channels having first closed ends and second channels having second closed ends, the guide wall having an end portion in contact with the cooling fins of the fin plate to allow the cooling fluid to flow in sequence through the first channels, between the cooling fins of the fin plate in the manifold cover, and through the second channels, wherein the end portion of the guide wall overlaps the cooling fins of the fin plate when the power module and the fin plate are mounted on the manifold cover.

2. The cooling apparatus of claim 1, wherein the end portion of the guide wall is inclined in a direction perpendicular to the first channels and the second channels and has an inclined surface.

3. The cooling apparatus of claim 1, wherein both sides of the end portion of the guide wall are inclined in a direction perpendicular to the first channels and the second channels.

4. The cooling apparatus of claim 1, wherein the end portion of the guide wall comprises a plurality of contact points with the cooling fins of the fin plate in which a width of a plurality of contact portions gradually decreases toward the fin plate.

5. The cooling apparatus of claim 1, further comprising a contact protrusion disposed on the end portion of the guide wall and extending in an extension direction of the cooling fins of the fin plate.

6. The cooling apparatus of claim 1, wherein the guide wall comprises:
   a plurality of wall units extending to divide the first channels and the second channels;
   first blocking units connected to first sides of the wall units to close the first closed ends of the first channels; and
   second blocking units connected to second sides of the wall units to close the second closed ends of the second channels.

7. The cooling apparatus of claim 6, wherein the first channels and the second channels are alternately arranged.

8. The cooling apparatus of claim 1, wherein the manifold cover is coupled to an edge of the fin plate by welding, bonding, or bolting.

9. An apparatus comprising:
   a manifold cover provided with an inner space that defines a flow path for a cooling fluid;
   a power module embedded in the flow path;
   a fin plate embedded in the manifold cover, in contact with the power module, and comprising a plurality of cooling fins on a surface of the fin plate, the cooling fins projecting toward an inner surface of the manifold cover, the cooling fins extending in a direction perpendicular to a flow direction of the cooling fluid; and
   a guide wall projecting from the inner surface of the manifold cover, the guide wall extending in the flow direction of the cooling fluid, the guide wall defines a plurality of first channels having first closed ends and second channels having second closed ends, the guide wall having an end portion in contact with the cooling fins of the fin plate to allow the cooling fluid to flow in sequence through the first channels, between the cooling fins of the fin plate in the manifold cover, and through the second channels, wherein the end portion of the guide wall overlaps the cooling fins of the fin plate when the power module and the fin plate are mounted on the manifold cover.

10. The apparatus of claim 9, wherein the end portion of the guide wall is inclined in a direction perpendicular to the first channels and the second channels and has an inclined surface.

11. The apparatus of claim 9, wherein both sides of the end portion of the guide wall are inclined in a direction perpendicular to the first channels and the second channels.

12. The apparatus of claim 9, wherein the end portion of the guide wall comprises a plurality of contact points with the cooling fins of the fin plate in which a width of a plurality of contact portions gradually decreases toward the fin plate.

13. The apparatus of claim 9, further comprising a contact protrusion disposed on the end portion of the guide wall and extending in an extension direction of the cooling fins of the fin plate.

14. The apparatus of claim 9, wherein the guide wall comprises:
   a plurality of wall units extending to divide the first channels and the second channels;
   first blocking units connected to first sides of the wall units to close the first closed ends of the first channels; and
   second blocking units connected to second sides of the wall units to close the second closed ends of the second channels.

15. The apparatus of claim 14, wherein the first channels and the second channels are alternately arranged.

16. The apparatus of claim 9, wherein the manifold cover is coupled to an edge of the fin plate by welding, bonding, or bolting.

17. An apparatus comprising:
   a power module;
   a manifold cover in which the power module is embedded, the manifold cover comprising a first manifold cover having an inlet and a second manifold cover having an outlet, wherein the manifold cover is provided with an inner space defining a flow path for a cooling fluid;
   a plurality of fin plates embedded in the manifold cover, each of the fin plates in contact with a respective one of two side surfaces of the power module, wherein each of the fin plates comprises a plurality of cooling fins on a surface of the fin plate, the cooling fins projecting toward an inner surface of an opposing one of the first and second manifold covers, the cooling fins of each fin plate extending in a direction perpendicular to a flow direction of the cooling fluid, the plurality of fin plates comprising a first fin plate having a first flow hole defined therein, and a second fin plate having a second flow hole defined therein, wherein both sides of the power module are configured to be cooled by a flow of the cooling fluid between the first manifold cover and the second manifold cover; and
   a plurality of guide walls each projecting from the inner surface of a respective one of the first and second manifold covers, each of the guide walls extending in the flow direction of the cooling fluid, each of the guide walls defines to define a plurality of first channels having first closed ends and second channels having second closed ends, each of the guide walls having an end portion in contact with the cooling fins of a corresponding one of the first and second fin plates such that the cooling fluid is allowed to flow in sequence through the first channels, between the cooling fins of the corresponding one of the first and second fin plates, and through the second channels, wherein the end portion of each of the guide walls overlaps the cooling fins of the corresponding one of the first and second fin plates when the power module and the fin plate are mounted on the manifold cover.

18. The apparatus of claim 17, wherein:
   the inlet is provided at a first side of the first manifold cover and the outlet is provided at a first side of the second manifold cover; and
   the first flow hole of the first fin plate and the second flow hole of the second fin plate are formed at second sides of the first manifold cover and the second manifold cover.

* * * * *